United States Patent
Conte et al.

(10) Patent No.: US 7,742,342 B2
(45) Date of Patent: Jun. 22, 2010

(54) BIASING CIRCUIT FOR EEPROM MEMORIES WITH SHARED LATCHES

(75) Inventors: Antonino Conte, Tremestieri Etneo (IT); Gianbattista Logiudice, Pedara (IT); Giovanni Matranga, Catania (IT); Mario Micchche', Agrigento (IT); Carmelo Ucciardello, Catania (IT); De Costantini Diego, Augusta (IT)

(73) Assignee: STMicroelectronics S.r.L., Agrate Brianza (MI) (IT)

( * ) Notice: Subject to any disclaimer, the term of this patent is extended or adjusted under 35 U.S.C. 154(b) by 208 days.

(21) Appl. No.: 11/977,876

(22) Filed: Oct. 26, 2007

(65) Prior Publication Data

US 2008/0101125 A1    May 1, 2008

(30) Foreign Application Priority Data

Oct. 27, 2006    (IT)    .................... MI2006A002068

(51) Int. Cl.
 *G11C 16/06*    (2006.01)

(52) U.S. Cl. ........................... 365/185.23; 365/185.18; 365/185.11

(58) Field of Classification Search ............. 365/185.23, 365/185.18, 185.11
See application file for complete search history.

(56) References Cited

U.S. PATENT DOCUMENTS 6,639,838 B2 *   10/2003   Fournel et al.  .........  365/185.23

* cited by examiner

*Primary Examiner*—Huan Hoang
(74) *Attorney, Agent, or Firm*—Lisa K. Jorgenson; William R. McClellan; Wolf, Greenfield & Sacks, P.C.

(57) ABSTRACT

An EEPROM memory having a matrix of individually selectable memory cells, the matrix having a plurality of columns, a plurality of data lines each coupled with the cells of a corresponding column, the data lines being grouped in a plurality of packets, a plurality of biasing elements for providing a biasing signal to the data lines, and means for selecting the biasing elements for a selected one of the packets, wherein each biasing element is associated with corresponding data lines of a plurality of packets, the biasing element comprising switching means for selectively applying the biasing signal to a selected one of the associated data lines.

15 Claims, 5 Drawing Sheets

BIASING CIRCUIT FOR EEPROM MEMORIES WITH SHARED LATCHES

BACKGROUND OF THE INVENTION

1. Field of the Invention

The present invention relates to the electronics field. More specifically, the present invention relates to EEPROM memories.

2. Discussion of the Related Art

Memories are commonly used in several applications for storing information temporarily, in the so-called volatile memories, or permanently, in the so-called non-volatile memories, which are able to preserve the information also in absence of power supply. A particular type of non-volatile memories consists of the EEPROM ("Electrically Erasable Programmable Read Only Memory") type.

An EEPROM memory comprises a matrix of cells, which can be electrically programmed and erased. Each memory cell is formed by a memory element (such as a floating gate MOS transistor) in series to a selection MOS transistor. The programming and erasing operations on the memory cell are assisted by the known Fowler-Nordheim mechanism, which causes the passage of charge (electrons) by tunnel effect from and to the floating gate of the floating gate MOS transistor. In such a way, the memory cell stores a logic value defined by the threshold voltage of the floating gate MOS transistor, which depends on the electric charge stored on the gate thereof. The selection transistor is used for accessing the floating gate MOS transistor and in particular for biasing it by suitable biasing voltages so as to perform the desired operation. In detail, in order to store (positive or negative) charge on the floating gate of the floating gate MOS transistor—and thus obtain significant Fowler-Nordheim currents (for example, 60 pA/cell)—it is needed to apply high programming or erasing voltages, denoted as a whole as writing voltages (for example, 12V-13V) to the memory cell.

The memory cells are arranged in the matrix in rows and columns. In particular, the memory cells arranged on a same row are grouped in one or more words and are connected to a common word line, whereas the memory cells arranged on a same column are connected to a common bit line.

For retrieving or storing the information, the memory comprises a decoding system, which is adapted to decode an input address identifying one or more memory cells. In particular, the decoding system comprises a row decoder for selecting a word line and a column decoder for selecting one or more bit lines. Such decoders receive low voltage input logic signals (that is of the order of a power supply of the memory—for example 1.65V), but have to be able to apply the high writing voltages required during the erasing and programming operations to the word line and to the selected bit lines—which writing voltages are higher than the power supply of the memory and are usually generated by means of suitable circuits (for example, charge pumps) provided within the memory.

Thus, such biasing circuits have to include high voltage electronic components, which are able to sustain (between the terminals thereof) voltage differences at least equal to the writing voltage. For example, these components can be high voltage MOS transistors, which are designed in such a way to avoid the breaking of the gate oxide or the breakdown of the junctions when voltage differences equal or higher than the writing voltages are applied between the terminals thereof.

The high voltage MOS transistors have a sufficiently thick gate oxide (of the order of 15 nm) since the voltage differences sustained between the terminals thereof are higher as the gate oxide is thicker. For this reason, the high voltage MOS transistors and thus also the biasing circuits occupy a significant area of a semiconductor material chip wherein the EEPROM memory is integrated.

Moreover, since typically the EEPROM memories provide a biasing circuit for each bit line, this problem is more evident as the number of the bit lines increases.

Another problem of the EEPROM memory is to ensure that the memory cells are correctly written. Indeed, when one or more memory cells of the EEPROM memory are programmed, it can happen that, because of leakage phenomena, the information stored in the remaining memory cells (that is those which are not to be programmed) is changed. Indeed, such leakage phenomena cause an undesired emptying of the floating gates of the floating gate MOS transistors of the non-selected memory cells, so that the corresponding threshold voltage takes values different from the expected ones. For avoiding such inconvenience, the known solutions provide the use of decoding systems wherein the transistors used for providing the writing voltages to the bit lines are n-channel MOS transistors (since the leakage phenomena are lower with respect to those of n-channel type). However, because of the body effect, such transistors have to be able to sustain voltages even higher than the writing voltages between the terminals thereof; this further increases the area occupied on the semiconductor material chip.

SUMMARY OF THE INVENTION

At least one embodiment of the present invention provides a solution based on the idea of reducing the number of biasing circuits.

In particular, an aspect of the present invention provides an EEPROM memory comprising a matrix of individually selectable memory cells. The matrix has a plurality of columns and a plurality of data lines each coupled with the cells of a corresponding column; the data lines are grouped in a plurality of packets. A plurality of biasing elements is provided for applying a biasing signal to the data lines; the memory further comprises means for selecting the biasing elements for selecting a selected one of the packets. Each biasing element is associated with corresponding data lines of a plurality of packets; the biasing element comprises switching means for selectively applying the biasing signal to a selected one of the associated data lines.

In one embodiment of the invention, each biasing element is associated with the data lines of two adjacent packets.

According to another embodiment, the memory includes means for providing a clamping signal to the non-selected data lines.

According to another embodiment, a first switch is provided for applying a programming voltage to the selected data line through second switches driven by corresponding selection signals of the associated packets.

According to another embodiment, the memory provides a third switch for selectively applying the clamping signal to the non-selected data lines through fourth switches.

According to another embodiment, a fifth switch is provided for supplying a comparison voltage to the selected data line through sixth switches driven by the same selection signals.

According to another embodiment, a seventh switch is provided for applying the clamping signal to the sixth switches.

According to another embodiment, the first switch and the second switches are implemented by transistors of a first type.

According to another embodiment, the third switch and the fourth switches are implemented by transistors of a second type.

According to another embodiment, the fifth transistor and the sixth transistors are implemented by transistors of the second type.

According to another embodiment, the seventh switch is implemented by a transistor of the second type.

According to another embodiment, the memory includes transistors, which are able to sustain voltage differences between the terminals thereof that are not higher than the programming voltage.

According to another embodiment, the transistors of the first type are p-channel MOS transistors and the transistors of the second type are n-channel MOS transistors.

The same solution is also applied for biasing the word lines.

According to another embodiment, a system comprising an EEPROM memory of the described-type is provided.

A further aspect of the present invention provides a corresponding operating method of an EEPROM memory.

BRIEF DESCRIPTION OF THE DRAWINGS

Further features and advantages of the invention will be best understood by reference to the following detailed description, given purely by way of a non-restrictive indication, to be read in conjunction with the accompanying drawings. In particular.

DETAILED DESCRIPTION

Figure 1:
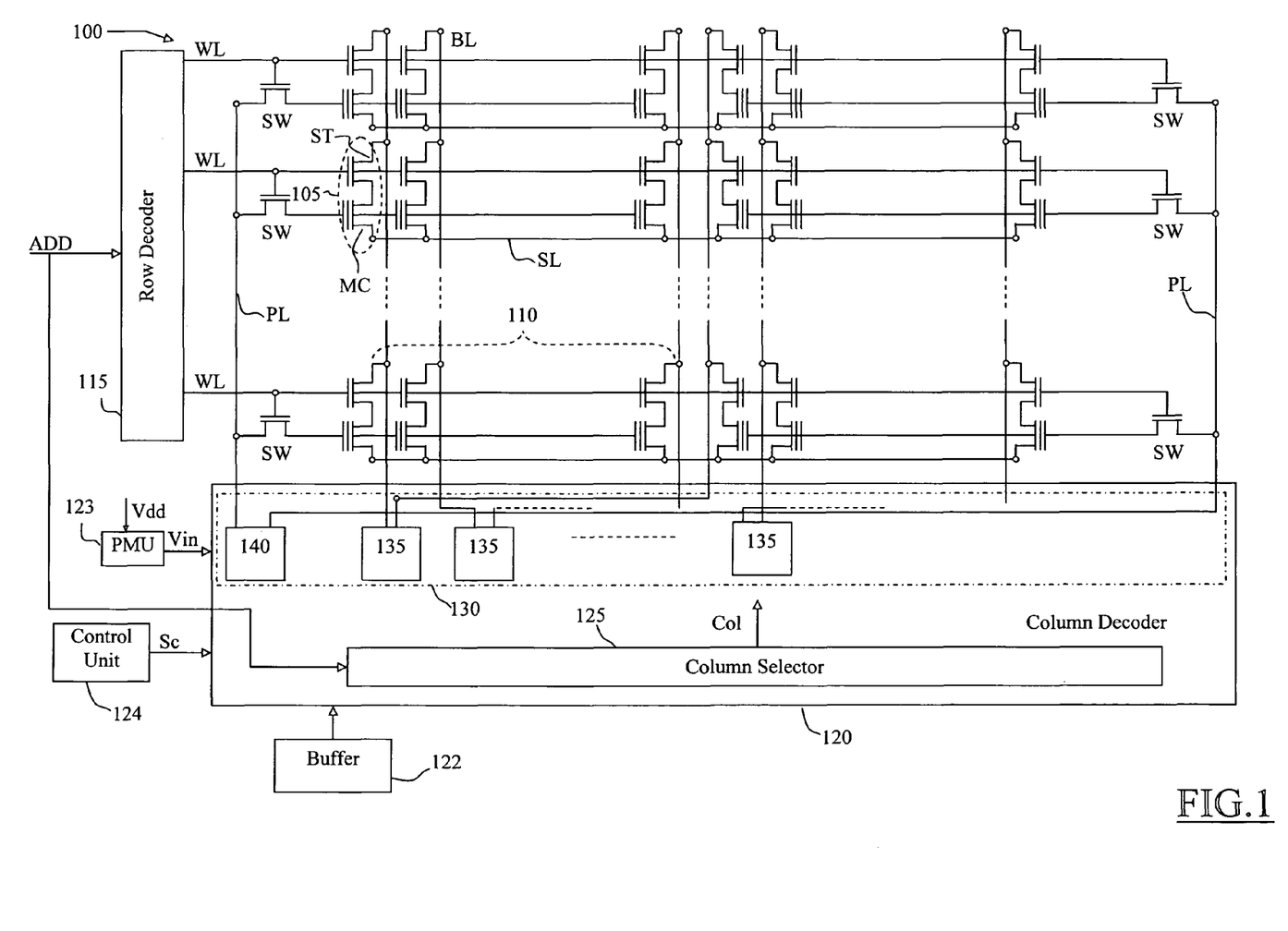
FIG. 1 shows a basic block diagram of a memory wherein the solution according to an embodiment of the present invention is usable.

Referring in particular to FIG. 1, a non-volatile memory 100 of EEPROM type is shown. The EEPROM memory is generally used in a complex electronic system (not shown in figure) as a smart card, an MP3 player, and like. The memory 100 comprises a matrix of memory cells 105 each one realized by a floating gate MOS transistor MC in series to a selection transistor ST (both of n-channel type).

In a programmed condition each memory cell 105 has the transistor MC with a low threshold voltage (thus with a floating gate substantially emptied of electrons), to which a logic value "1" is conventionally associated. The cell 105 is erased by means of the injection of electrons into the floating gate of the transistor MC that thus brings itself to a high threshold voltage (to which a logic value "0" is associated). Thus, when the memory cell 105 is biased for the reading, it is conductive if it is programmed or not conductive if it is erased.

The memory cells 105 are arranged in a plurality of rows and columns. The memory cells 105 of each row are coupled with a corresponding word line WL whereas the memory cells 105 of each column are coupled with a corresponding bit line BL. The memory cells 105 arranged on the same row are grouped in one or more words 110 (for example, each comprising 8 memory cells 105). In particular, in each memory cell 105 the transistor ST has a gate terminal connected to the corresponding word line WL, a drain terminal connected to the corresponding bit line BL, and a source terminal connected to the drain terminal of the corresponding transistor MC. The transistors MC of each word have control terminals connected to a word selector (for example, implemented by an n-channel MOS transistor SW). In detail, the transistor SW has a gate terminal connected to the corresponding word line WL, a drain terminal connected to the control terminal of the transistors MC of the respective word and a source terminal that is connected to a word selection line PL associated with a corresponding packet of bit lines BL. All the transistors MC have a source terminal, which is connected to a common source line SL.

The memory 100 receives an address ADD for the selection of a desired word. A portion of the address ADD is provided to a row decoder 115, which selects the word line WL corresponding to the desired word. The other portion of the address ADD is supplied to a column decoder 120 that selects the packet of bit lines BL corresponding to the desired word; the column decoder 120 is coupled with an input buffer 122 that receives information from the outside to be written into or provides information to the outside read from the memory cells 105 of the selected word (by the row decoder 115 and the column decoder 120).

The memory 100 further comprises a power management unit (PMU) 123 and a control unit 124. The PMU 123 provides the biasing voltages used for the managing of the various operations on the memory 100, for example from 1V to 13V (denoted as a whole with Vin); the biasing voltages Vin are generated (for example, by charge pumps) starting from a supply voltage Vdd provided from the outside (typically, 1.65V). The control unit 124 provides the control signals (denoted as a whole with Sc), which are used for driving the various components of the memory 100.

Considering in particular the column decoder 120, it comprises a column selector 125, which receives the corresponding portion of the address ADD and provides a set of logic signals (denoted as a whole with Col) to a biasing block 130. The biasing block 130 comprises a biasing circuit 135 for each pair of bit lines BL; the bit lines BL of the pair occupy the same position in two adjacent packets. The column decoder 120 further comprises a gate biasing circuit 140 for the corresponding pair of the word selection lines PL. The biasing circuits 135 comprise the components, which are required for writing, reading and erasing the desired logic values in the selected memory cells 105.

It should be noted that according to an embodiment of the present invention each biasing circuit 135 is shared between two bit lines BL. In such a way, the number of the biasing circuits 135 is significantly reduced (in the example at issue approximately of 50%) with respect to the known solutions. This allows reducing the size of the column decoder 120, with the advantage of a reduced area occupation of a chip wherein the memory 100 is integrated. Similar considerations apply to the gate biasing circuit 140.

During a writing operation of a selected memory cell 105 to be programmed (that is to be brought to the logic value "1"), the column decoder 120 selects the corresponding bit line BL by the respective biasing circuit 135. In such a way, a programming pulse—belonging to the complex of the biasing voltages Vin—for example, having a ramp linear pattern, which starting from a reference voltage or ground (0V) reaches a programming voltage Vp (for example, 13V) in some tens of µs—is applied to the selected bit line BL. The remaining bit lines BL are brought to a clamped voltage VCL—further belonging to the biasing voltages Vin—which is lower than the programming voltage Vp (for example, VCL=4V). At the same time, the row decoder 115 brings the voltage of the word line WL corresponding to the selected memory cell to the value of the programming voltage Vp plus at least the value of a threshold voltage of the transistor ST (for example, 13+1=14V), whereas the remaining word lines WL are left at the reference voltage. All the word selection lines PL are brought to the reference voltage by the corresponding biasing circuit 140, whereas the common source line SL is left floating. In such a way, the switch SW corresponding to the word 110 to which the selected memory cell 105 belongs is closed. Thus, in the selected memory cell 105, the control terminal of the transistor MC is brought to the reference voltage; moreover, the transistor ST (on) brings the drain terminal of the transistor MC to the value of the programming voltage Vp thereby allowing its programming.

The memory cells 105 belonging to the same word 110 to which the selected memory cell 105 belongs (but which have not to be programmed) remain in the starting state since the clamped voltage VCL ensures that the voltage difference between the control terminal of the transistor MC and the drain terminal thereof is insufficient for causing a charge passage (thereby avoiding an undesired programming thereof). Moreover, the memory cells 105 of the other words 110 remain in the starting state since the corresponding transistors ST are off.

The feature of applying the clamped voltage VCL avoids any risk of undesired programming; indeed, it should be noted that if the bit lines of the memory cells being not selected for the programming operation were left floating (as it happens in the known solutions), in such memory cells 105 could conduct significant leakage currents so modifying the logic value stored therein. Indeed, the voltage reached by the drain terminals of the corresponding transistors MC could bring itself (thanks to the fact that the corresponding transistors ST are on) to a value such that to cause a charge passage in the floating gate thereof thereby programming the cells.

During a reading operation of a selected memory cell 105 the column decoder 120 biases the corresponding bit line BL to a comparison voltage Vc (for example, 0.8V) provided by a sense amplifier included in the corresponding biasing circuit 135, whereas the other bit lines BL are kept to the reference voltage. The common source line SL is kept to the reference voltage whereas the row decoder 115 brings the word line WL corresponding to the selected memory cell 105 to an on voltage Von (for example, 5V); moreover, the gate biasing circuit 140 corresponding to the selected memory cell 105 brings its word selection line PL to a reading voltage Vr (for example, 1V) whereas the other word selection line PL to which it is associated is brought to the reference voltage. Also the other word selection lines PL are brought to the reference voltage by the corresponding gate biasing circuits 140. In such a way, the switch SW corresponding to the word 110 to which the selected memory cell 105 belongs is on so that the reading voltage Vr is applied to the control terminal of its transistor MC. If the memory cell 105 is programmed, it will be conductive and the current thereof is detected by the sense amplifier provided in the biasing circuit 135; vice versa, if the selected memory cell 105 is erased it will be not conductive. The remaining cells 105 connected to the same bit line BL do not affect the reading operation since the corresponding switches SW and ST are off, whereas the memory cells 105 belonging to the words that share the same word line WL of the selected memory cell 105 will be always off since they receive the reference voltage at the control terminal of the corresponding transistors MC.

An erasing operation affects all the memory cells 105 belonging to the same selected word (to be brought to the logic value "0"). For this purpose, the biasing circuit 140 brings the source terminal of the switch SW corresponding to the selected word 110 to an erasing voltage Ve (for example, 12.5V) belonging to the complex of the biasing voltages Vin. At the same time, the row decoder 115 brings the word line WL corresponding to the selected word 110 to the value of the erasing voltage Ve plus at least the value of the threshold voltage of the switch SW (for example, 12.5+1=13.5V), whereas the other word lines WL remain at the reference voltage (0V). The common source line SL is kept to the reference voltage, whereas the column decoder 120 leaves all the bit lines BL floating. In such a way, the switch SW corresponding to the selected word 110 is on whereas the switches SW corresponding to the other words 110 to be left in the starting state are off. The erasing voltage Ve is then transferred to the control terminals of the transistors MC of the selected word 110, so that all the memory cells 105 thereof can be erased. The remaining words 110 have the switch SW that, since it is off, prevents the passage of the erasing voltage Ve to the corresponding memory cells 105, which thus remain in the starting state.

Figure 2:
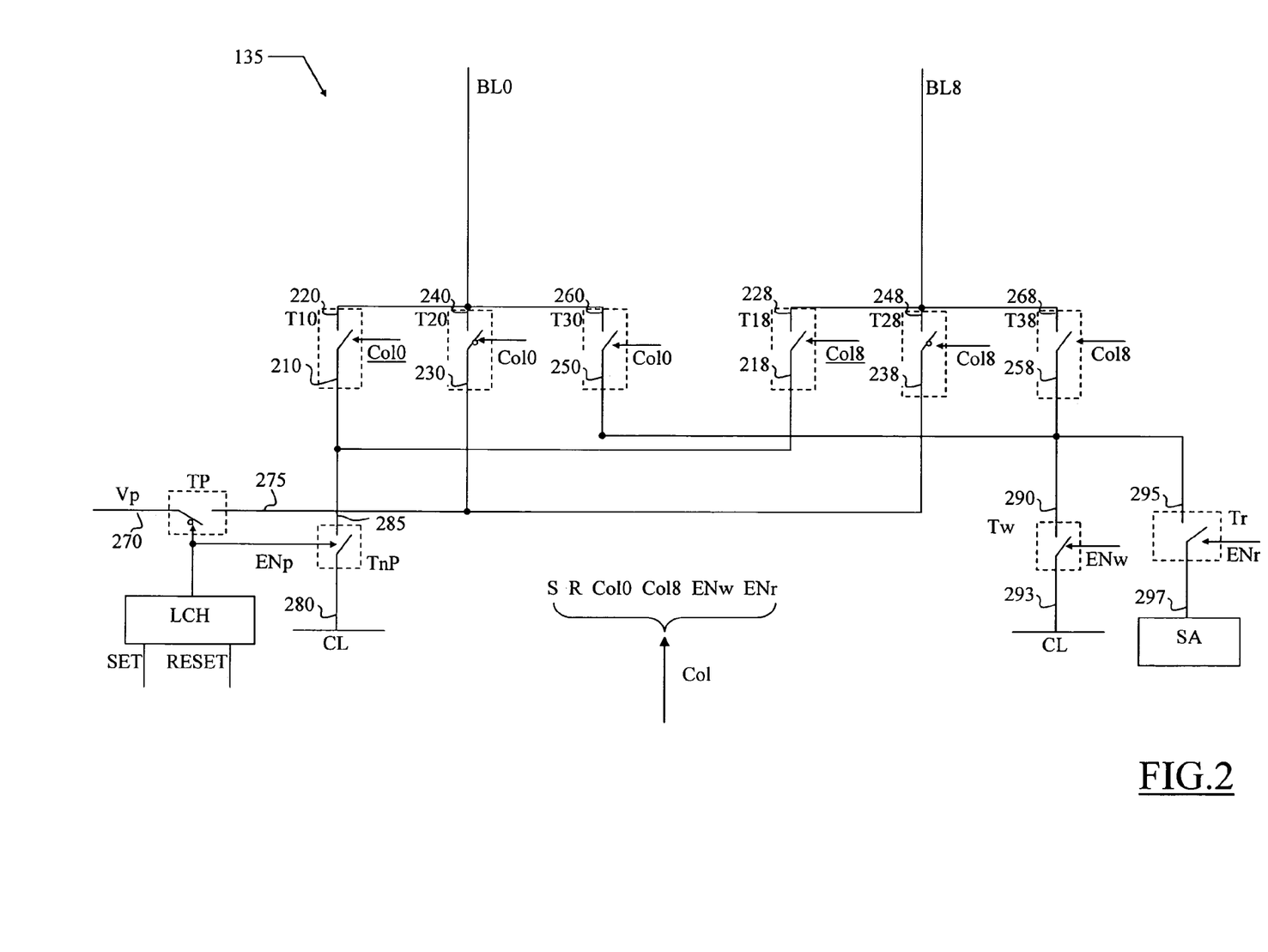
FIG. 2 shows a basic block diagram of a biasing circuit according to an embodiment of the present invention.

Referring to FIG. 2, an exemplary scheme of a biasing circuit 135 is shown, only with respect to the blocks being relevant for understanding the present invention. The gate biasing circuit 140 has a similar structure.

In particular, the biasing circuit 135 of the example at issue is used for biasing the first bit lines of two adjacent packets. The bit lines shown in figure (and all the associated elements) are differentiated by adding an index 0 or 8 to the reference (that is, BL0 and BL8). The biasing circuit 135 comprises a set of switches T10, T20, T30 and T18, T28, T38 (corresponding to the bit line BL0 and to the bit line BL8 respectively), which are controlled by a driving signal Col0 and Col8, respectively (belonging to the logic signals Col).

More in detail, the switch T10 has a first terminal 210 connected to a first terminal 218 of the switch T18; the switches T10 and T18 have corresponding second terminals 220 and 228 connected to the bit line BL0 and to the bit line BL8, respectively. The switch T10 and the switch T18 are enabled by complemented signals Col0 and Col8, respectively. The switches T10 and T18 are normally open, thus when the signals Col0 and Col8 are deasserted (for example, at the reference voltage) the switches T10 and T18 are open; vice versa, when the signals Col0 and Col8 are asserted (for example, at the programming voltage) the switches T10 and T18 are closed.

The switch T20 has a first terminal 230 connected to a first terminal 238 of the switch T28; the switches T20 and T28 have corresponding second terminals 240 and 248 connected to the bit line BL0 and to the bit line BL8, respectively. The switch T30 has a first terminal 250 connected to a first terminal 258 of the switch T38; the switches T30 and T38 have corresponding second terminals 260 and 268 connected to the bit line BL0 and to the bit line BL8, respectively. The pairs of switches T20 and T30 and T28 and T38 are driven by the signals Col0 and Col8, respectively. The switches T20 and T28 are normally closed (denoted by a corresponding little spot) whereas the switches T30 and T38 are normally open. Thus, when the signals Col0 and Col8 are asserted the switches T20 and T28 are open whereas the switches T30 and T38 are closed; vice versa when the signals Col0 and Col8 are deasserted the switches T20 and T28 are closed whereas the switches T30 and T38 are open.

The biasing circuit 135 also comprises a memory circuit LCH, which in response to two control signals SET and RESET (belonging to the logic signals Col) controls a switch Tp by a programming enabling signal ENp. The memory circuit LCH allows setting the selection of the memory cells to be programmed in a preliminary phase (before the actual writing operation). In particular, when the control signal SET is asserted and the control signal RESET is deasserted, the memory circuit LCH deasserts the programming enabling signal ENp; vice versa, when the control signal SET is deasserted and the control signal RESET is asserted, the memory circuit LCH asserts the programming enabling signal ENp. The switch Tp is normally closed, thus when the programming enabling signal ENp is asserted the switch Tp is open; vice versa, when the programming enabling signal ENp is deasserted the switch Tp is off. The switch Tp has a first terminal 270, which is input the programming voltage Vp, and a second terminal 275, which is connected to the terminal 230 of the switch T20 and to the terminal 238 of the switch T28. The switches T10 and T18 are further coupled with a switch Tnp, which has a first terminal 280 connected to a distribution line CL (which receives the clamped voltage VCL during the writing operation and the reference voltage during the reading operation) and a second terminal 285 that is connected to the terminal 210 of the switch T10 and to the terminal 218 of the switch T18. The switch Tnp is controlled by the programming enabling signal ENp. In detail, the switch Tnp is normally open, thus when the programming enabling signal ENp is asserted, the switch Tnp is closed; vice versa, when the programming enabling signal ENp is deasserted, the switch Tnp is open.

The switches T30 and T38 are instead coupled with a switch Tw and a switch Tr. In particular, the switches T30 and T38 have the terminals 250 and 258 thereof connected to a first terminal 290 of the switch Tw, which has a second terminal 293 connected to the distribution line CL. The terminals 250 and 258 are also connected to a first terminal 295 of the switch Tr, which has a second terminal 297 connected to the sense amplifier SA.

The switches Tw and Tr are controlled by a writing enabling signal ENw and a reading enabling signal ENr, respectively (belonging to the logic signals Col). The switches Tw and Tr are normally open, thus when the writing enabling signal ENw and the reading enabling signal ENr are asserted the switches Tw and Tr are closed; vice versa, when the writing enabling signal ENw and the reading enabling signal ENr are deasserted the switches Tw and Tr are open.

The operation of the biasing circuit 135 during the writing and reading operations will be now described in the case in which the selected memory cell is coupled with the bit line BL0 (similar considerations apply when the selected memory cell is coupled with the bit line BL8).

During the writing operation, the writing enabling signal ENw is asserted whereas the reading enabling signal ENr is deasserted. In such a way, the switch Tw is closed whereas the switch Tr is open. In particular, during an initial phase of the writing operation, the memory circuit LCH is charged to an initial condition corresponding to the operation to be performed on the selected bit line BL0. Let us assume that the memory cell has to be programmed. For this purpose, the signal SET is asserted whereas the signal RESET is deasserted. In such a way, the memory circuit LCH deasserts the programming enabling signal ENp so closing the switch Tp and opening the switch Tnp. Alternatively, the programming enabling signal ENp can be provided outside the biasing circuit 135, for example, through the set of the logic signals Col.

Subsequently, the programming pulse is applied, and the signal Col8 is asserted whereas the signal Col0 is deasserted. In such a way, the switch T20 is closed by bringing the bit line BL0 to the programming voltage Vp. The other switches T30, T18, T28 are open. The switch T10 is closed but since it is connected to the switches T18 and Tnp (open) it does not interfere with the operation of the biasing circuit 135.

Vice versa, when the memory cell coupled with the bit line BL0 has to remain in the starting state, the signals SET and Col0 are asserted whereas the signals RESET and Col8 are deasserted. In such a way, the switch Tp is still closed (since the memory circuit LHC deasserts the programming enabling signal ENp) but because the switch T20 is open the programming voltage Vp is not transferred to the bit line BL0, which instead brings itself to the clamped voltage VCL through the switch T30 (which is closed). The remaining switches T10 and T38 are open. The switch T18 is closed but since it is connected to the switches T10 and Tnp (open) it does not interfere in any way with the operation of the biasing circuit 135.

When the memory cells coupled with the bit lines BL0 and BL8 are not selected for the writing operation, the signals RESET and Col8 are asserted whereas the signals SET and Col0 are deasserted. In such a way, the memory circuit LCH asserts the programming enabling signal ENp by closing the switch Tnp and opening the switch Tp (so as to insulate the bit lines BL0 and BL8 from the programming voltage Vp). In such case, the switches T10 and T38 are closed bringing the bit lines BL0 and BL8 to the clamped voltage VCL by the (closed) switches Tnp and Tw, respectively. The remaining switches T30, T18 and T28 are open, not interfering with the voltage reached by the bit lines BL0 and BL8. The switch T20 is closed but it does not interfere with the value reached by the bit lines BL0 and BL8 since it is connected to the switches T28 and Tp (open).

During the reading operation, the distribution line CL receives the reference voltage. The reading enabling signal ENr is asserted whereas the writing enabling signal ENw is deasserted. In such a way, the switch Tr is closed whereas the switch Tw is open. Moreover, the signals RESET and Col0 are asserted whereas the signals SET and Col8 are deasserted. In such a way, the memory circuit LCH asserts the programming enabling signal ENp so that the switch Tp is open and the switch Tnp is closed. The switch T30 is closed so that the bit line BL0 is connected to the sense amplifier SA (from which it receives the comparison voltage Vc); vice versa the switches T10 and T20 are open. The switch T18 is closed so that the bit line BL8 brings itself to the reference voltage. The switch T38 is open; the switch T28 is closed but it does not interfere in any way on the operation of the biasing circuit 135 since it is connected to two open switches (T20 and Tp).

When the memory cells coupled with the bit lines BL0 and BL8 are not selected for the reading, the control signal RESET is asserted and the signals SET, Col0 and Col8 are deasserted. Also in this case, the memory circuit LCH asserts the programming enabling signal ENp by opening the switch Tp. The switch T10 is closed so that the bit line BL0 brings itself to the reference voltage. Also the bit line BL8 brings itself to the reference voltage since the switch T18 is closed. The switches T30 and T38 are open; vice versa the switches T20 and T28 are closed but they do not interfere on the value reached by the bit lines BL0 and BL8 since they are connected to the open switch Tp.

Figure 3:
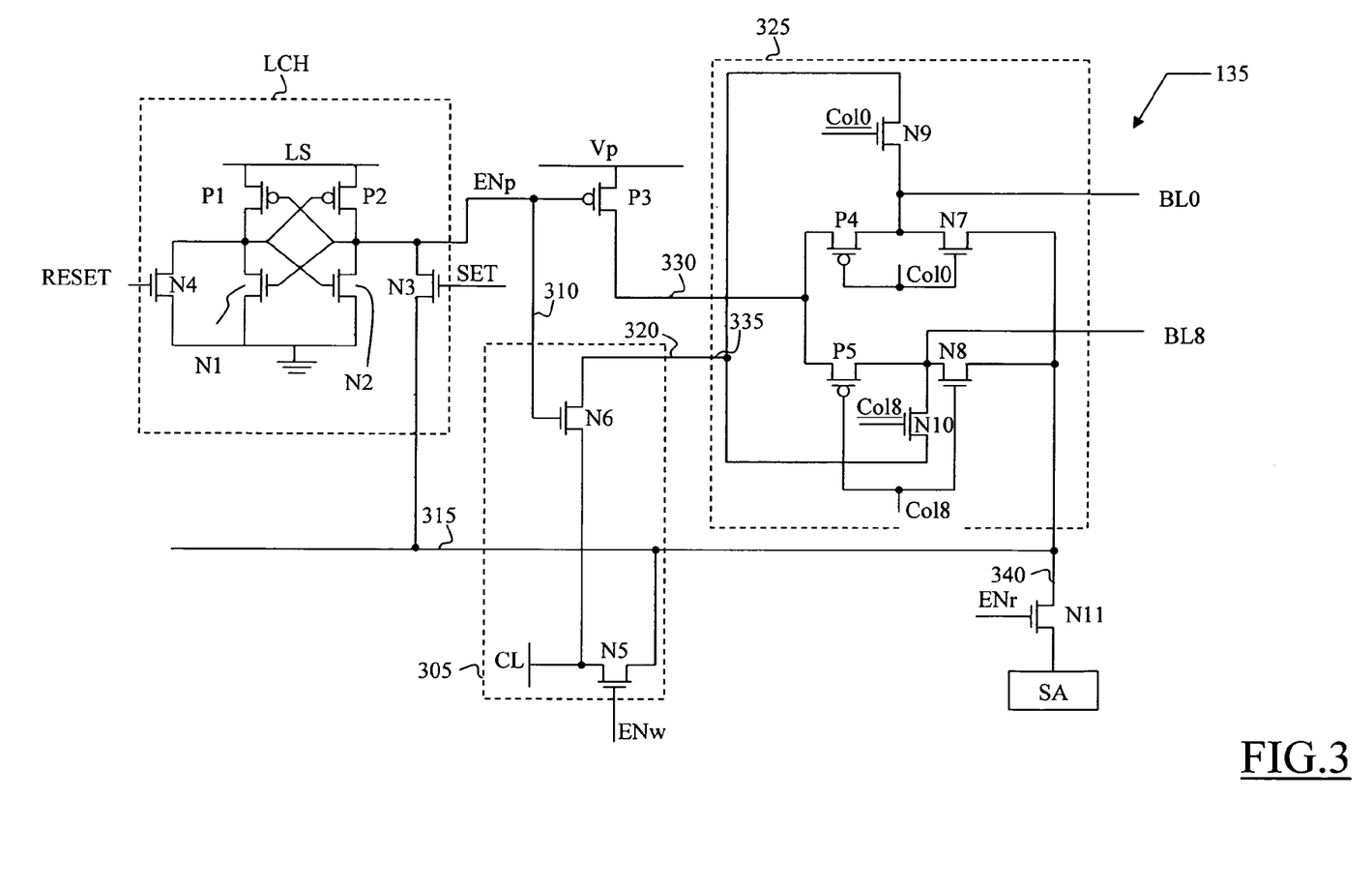
FIG. 3 shows an exemplary electrical scheme of the biasing circuit of FIG. 2 according to an embodiment of the present invention.

Considering now FIG. 3 together with FIG. 2, an exemplary implementation of the biasing circuit 135 according to an embodiment of the invention is shown.

Two p-channel MOS transistors P1 and P2 and two n-channel MOS transistors N1 and N2 are connected according to a latch architecture. The transistors P1 and P2 have corresponding source terminals connected to a source distribution line LS (which is used for bringing the source terminal of the transistors P1 and P2 to a biasing voltage depending on the operation to be performed) whereas the transistors N1 and N2 have corresponding source terminals kept at ground. A drain terminal of the transistor P2 provides the programming enabling signal ENp. Two n-channel MOS transistors N3 and N4 are driven by the control signals SET and RESET, respectively, and are used for setting the state of the latch P1, P2, N1, N2. In detail, the transistor N3 has a drain terminal connected to the drain terminal of the transistor P2, a control terminal that receives the control signal SET and a source terminal coupled with a clamping circuit 305; the transistor N4 is connected in parallel to the transistor N1. The clamping circuit 305 has an input terminal 310 (connected to the drain terminal of the transistor P2), a first output terminal 315 (connected to the source terminal of the transistor N3) and a second output terminal 320. The clamping circuit 305 comprises two n-channel MOS transistors N5 and N6. In particular, the transistor N5 has a drain terminal connected to the distribution line CL, a control terminal driven by the writing enabling signal ENw and a source terminal that is connected to the first output terminal 315; the transistor N6 has a control terminal connected to the input terminal 310 (so receiving the programming enabling signal ENp), a source terminal connected to the drain terminal of the transistor N5 and a drain terminal connected to the second output terminal 320.

A p-channel MOS transistor P3 has a control terminal, which receives the programming enabling signal ENp, a source terminal, which receives the programming voltage Vp, and a drain terminal, which is coupled with a selection circuit 325. In detail, the selection circuit 325 has two input terminals 330 and 335 (connected to the drain terminal of the transistor P3 and to the drain terminal of the transistor N6, respectively) and an output terminal 340 (connected to the output terminal 315 of the clamping circuit 305). The selection circuit 325 comprises a set of n-channel MOS transistors N7, N8, N9 and N10 and two p-channel MOS transistors P4 and P5. In particular, the transistor N7 is connected in series to the transistor P4; the transistors P4 and N7 are driven by the signal Col0 (that is they receive the signal Col0 at the corresponding control terminal). Moreover, the transistor P4 has a source terminal, which is connected to the input terminal 330, and a drain terminal, which is connected to a drain terminal of the transistor N7 that is also connected to the bit line BL0. The transistors P5 and N8 are connected in series to each other and receive the signal Col8 on the corresponding control terminal; the transistors P5 and N8 are connected in parallel to the two transistors P4 and N7; the transistor P5 has a drain terminal that is connected to the bit line BL8 and to the drain terminal of the transistor N8. The transistor N9 has a control terminal, which receives the complemented signal Col0, a drain terminal, which is connected to the input terminal 335, and a source terminal connected to the bit line BL0. The transistor N10 has a drain terminal connected to the bit line BL8, a source terminal connected to the drain terminal of the transistor N9 and a control terminal, which receives a complemented signal Col8. An n-channel MOS transistor N11 has a control terminal, which receives the writing enabling signal ENw, a drain terminal, which is connected to the output terminal 340 of the selection circuit 325, and a source terminal, which is connected to the sense amplifier SA. In particular, the source terminal of the transistor N11 is also coupled with the input buffer (not shown in figure) so as to transfer the reference voltage received from the outside to the source terminal of the transistor N3 during a setting initial phase of the biasing circuit 135.

All the p-channel transistors have corresponding substrate terminals connected to the corresponding source terminals so as to keep the corresponding threshold voltage stable as the voltage at terminals thereof varies. The n-channel transistors have corresponding substrate terminals kept at ground.

In such a way, the memory element LCH is implemented by means of transistors P1, P2, N1, N2, N3, N4; the switches Tp, Tw, Tnp, T10, T20, T30, T18, T28, T38 are instead implemented by means of the transistors P3, N5, N6, N9, P4, N7, N10, P5 and N8, respectively.

At the beginning (during the setting phase of the memory circuit LCH) the control signal SET and the reading enabling signal ENr are asserted. The writing enabling signal ENw is deasserted. Moreover, the sense amplifier SA is disabled so that the transistor N11 (on) brings the source terminal of the transistor N3 to the reference voltage received from the input buffer. In such a way, the transistor N3 brings the programming enabling signal ENp (that is the drain terminal of the transistor P2) to the reference voltage (since the control signal SET is asserted). The source terminal of the transistor P3 does not still receive the programming pulse so that the operation of the biasing circuit 135 is inhibited.

The operation of the biasing circuit during the writing and reading operations corresponds to what has been described in the foregoing (with reference to the bit line BL0).

During the writing operation, the writing enabling signal ENw is asserted (to the programming voltage Vp) whereas the reading enabling signal ENr is deasserted (to the reference voltage). The distribution line CL receives the clamping voltage VCL whereas the source distribution line LS receives the programming voltage Vp. In such conditions, the transistor N5 is on (so bringing the output terminal 315 to the clamping voltage VCL) whereas the transistor N11 is off. The control signal SET asserted turns on the transistor N3 that transfers the clamping voltage VCL to the control terminal of the transistor P3. In such biasing conditions, the transistor P3 is turned on.

Let us assume that the memory cell coupled with the bit line BL0 is selected for the programming operation. For this purpose, the signal Col0 is deasserted (to the reference voltage) while the signal Col8 is asserted (to the programming voltage Vp). In such conditions, the transistor P4 is on (so bringing the voltage of the bit line BL0 to the programming voltage Vp) whereas the transistors N7 and P5 are off. In such a way, the transistor P5 (off) insulates the bit line BL8 from the programming voltage Vp. The transistor N10 is off so that it does not interfere on the voltage value reached by the bit line BL0. At the same time, the transistor N8 is on so that the bit line BL8 brings itself to the clamped voltage VCL.

Vice versa, when the memory cell has to remain in the starting state, the signal Col0 is asserted while the signal Col8 is deasserted so that the transistor P5 is on while the transistor N8 is off. The transistor P4 is off so as to insulate the bit line BL0 from the programming voltage Vp. At the same time, the transistor N7 is on so that the bit line BL0 brings itself to the clamped voltage VCL. The transistor N9 is off so that the voltage value reached by the bit line BL0 does not interfere on the operation of the biasing circuit 135.

When the memory cells coupled with the bit lines BL0 and BL8 have to remain both in the starting state (that is they are both deselected for the writing operation), the control signal RESET is asserted (SET deasserted) so that the memory element LCH brings the enabling signal to the programming voltage Vp. In such biasing conditions, the transistor P3 is off so that the bit lines BL0 and BL8 are insulated from the programming voltage Vp. At the same time, the transistor N6 is on so that the input terminal 335 of the selection circuit 325 brings itself to the clamped voltage VCL and the transistor N9 (on) brings the bit line BL0 to the clamped voltage VCL. Moreover, also the transistor N8 is on so that the bit line BL8 brings itself to the clamped voltage VCL (through the transistor N5 that is on). The transistors P4, P5, N7 and N10 do not conduct so that they do not interfere on the voltage reached by the bit lines BL0 and BL8.

During the reading operation of a selected memory cell, the reading enabling signal ENr is asserted (so that the transistor N11 is on) whereas the writing enabling signal ENw is deasserted (so that the transistor N5 is off). The distribution line CL is brought to the reference voltage and the source distribution line LS is brought to the memory power supply (so as to allow an energy saving during the operation of the memory). The signal Col0 (asserted) turns on the transistor N7 so as to connect the bit line BL0 to the sense amplifier SA. The bit line BL8 is brought to the reference voltage since the transistors N6 and N10 are on. The others transistors are driven in such a way that they do not interfere with the value reached by the bit lines BL0 and BL8.

When the memory cells are not selected for the reading, both the bit lines BL0 and BL8 are brought to the reference voltage. Indeed, the signals Col0 and Col8 (both deasserted) turn on the transistors N9 and N10, respectively, so as to bring the bit lines BL0 and BL8 to the desired value (0V) through the transistor N6 (closed). Also in this case, the others transistors are biased in such a way that they do not interfere with the voltage values reached by the bit lines BL0 and BL8.

It should be noted that all the transistors of the biasing circuit 135 receive voltage differences between the terminal thereof at most equal to the programming voltage Vp so that they can be implemented with medium voltage transistors (of reduced size). This allows significantly reducing the size of the biasing circuit with respect to solutions wherein the transistors have to be able to sustain voltages even higher than the programming voltage Vp. This is possible thanks to the use of p-channel MOS transistors (for example, the p-channel MOS transistor P3), which thanks to the connection of the corresponding source terminal to the bulk terminal keep the threshold voltage thereof stable and can turn on with driving voltages (that is the voltage difference between the source terminal and the control terminal) which do not exceed the value of the programming voltage Vp. This is opposite to the known solutions wherein the switch Tp is implemented by an n-channel MOS transistor. In this case, indeed, during the transients the n-channel transistor has to be able to sustain voltages higher than the programming voltage (at least by a value equal to the threshold voltage thereof). Moreover, since the threshold voltage of the n-channel transistor is not stable, the voltages on the terminals thereof are dependent on the latter (so they might take significantly high values).

Embodiments of the present invention allow maintaining the leakage phenomena reduced while at the same time reducing the area occupied by the EEPROM memory on the semiconductor material chip. Such result is obtained through the use of the clamping circuit, which keeps stable the voltage reached by the non-selected bit line. Thus, even using a p-channel transistor, there are obtained leakage phenomena comparable to those, which would be obtained by using an n-channel transistor (at the same time reducing the area occupation).

Figure 4:
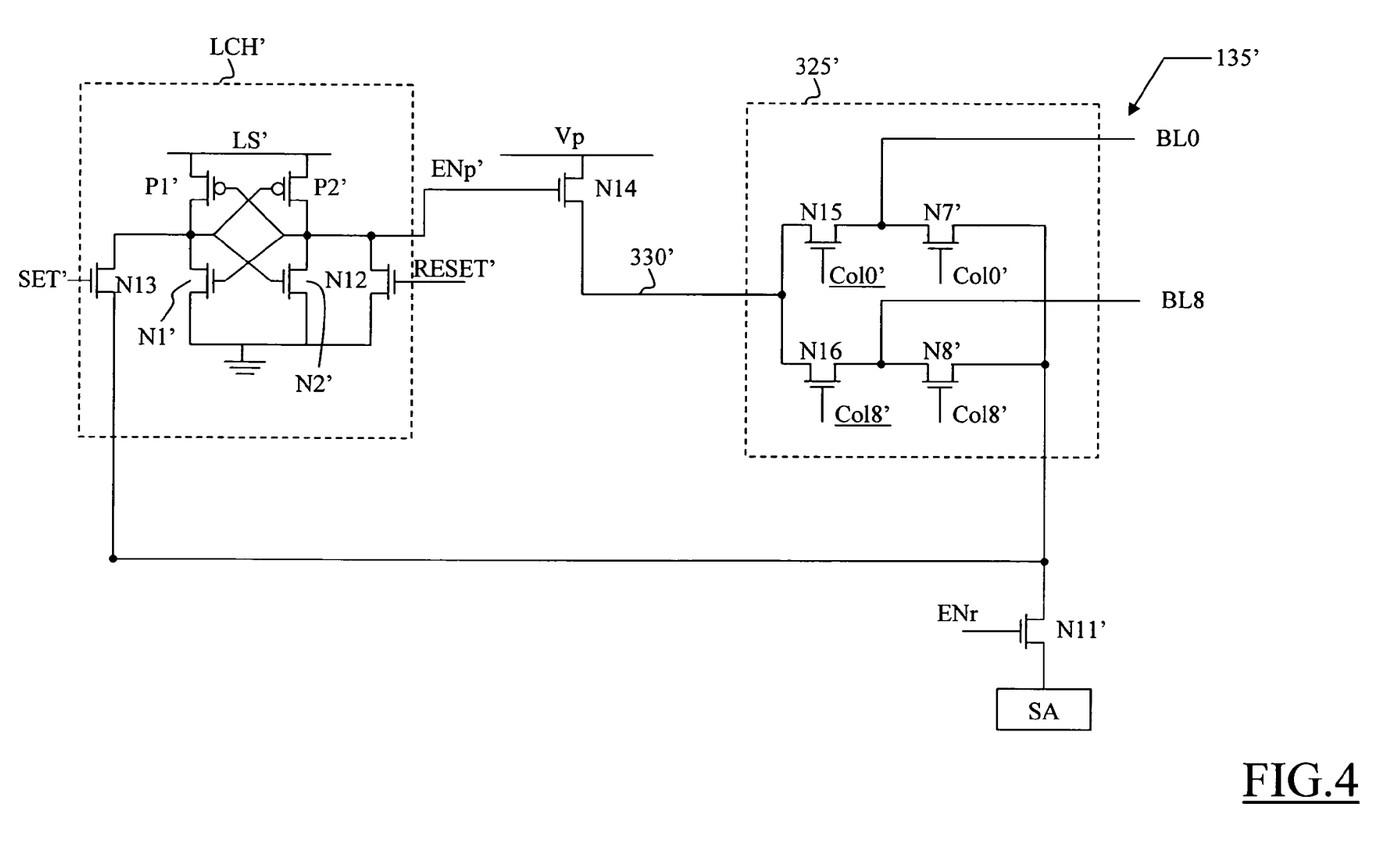
FIG. 4 shows an exemplary electric scheme of a biasing circuit according to a further embodiment of the present invention.

With reference to FIG. 4, an exemplary implementation of a biasing circuit 135' according to a further embodiment of the present invention is shown. The biasing circuit 135' has a structure similar to the one of the biasing circuit 135 shown in FIG. 3 (for this reason, similar elements are denoted with the same references with the adding of an apex) except for the lacking of the clamping circuit. In detail, two p-channel MOS transistors P1' and P2' and two n-channel MOS transistors N1', N2' are connected according to the architecture of the transistors P1-P2, N1-N2. An n-channel MOS transistor N12 is connected in parallel to the transistor N2' and receives the control signal RESET'; an n-channel MOS transistor N13 has a drain terminal that is connected to a drain terminal of the transistor N1', a control terminal that receives the control signal SET' and a source terminal that is coupled with a transistor N11'. An n-channel MOS transistor N14 has a control terminal that is connected to a drain terminal of the transistor N2' so receiving the programming enabling signal ENp', a drain terminal that receives the programming voltage Vp and a source terminal that is connected to an input terminal 330' of the selection circuit 325'. In detail, the selection circuit 325' comprises an n-channel MOS transistor N15 (instead of the transistor P4) that is connected in series to the transistor N7', and an n-channel transistor N16 (instead of the transistor P5) that is connected in series to the transistor N8'. The transistor N7' has a control terminal that receives the signal Col0', while the transistor N15 has a control terminal that receives the complemented signal Col0'. The transistor N8' has a control terminal that receives the signal Col8' while the transistor N16 has a control terminal that receives the complemented signal Col8'. The transistors N15 and N16 have a corresponding source terminal that is connected to the input terminal 330', while a drain terminal of the transistor N15 is connected to the bit line BL0 and a drain terminal of the transistor N16 is connected to the bit line BL8. The substrate terminals of all the n-channel transistors are kept at the reference voltage, while the substrate terminals of the p-channel transistors are connected to the corresponding source terminals.

Also in this case, the biasing circuit 135' allows significantly reducing the area occupied in a chip wherein the EEPROM memory is integrated since it is able to drive more bit lines.

However, for guaranteeing the correct operation of the circuit, all the transistors present in the biasing circuit 135' receive voltages even higher than the programming voltage Vp so that they have to be implemented with high voltage transistors.

For example, during the writing operation, the source distribution line LS' brings the source terminals of the transistors P1' and P2' to a voltage VLS' higher than the programming voltage Vp (for example, at least equal to the programming voltage Vp plus a value of the threshold voltage of the transistor N14). The memory circuit LCH' brings the programming enabling signal ENp' to the voltage VLS' so as to turn on the transistor N14. It should be noted that, during the starting phase of the programming pulse the transistor N14 sustains voltages higher than the programming voltage Vp at the terminals thereof, so that in order to allow the transistor to operate correctly it is should be a high voltage transistor. Similar considerations apply for the transistors P1', P2', N1' and N2', N12 and N13 of the latch.

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent elements (for example, with multilevel or phase-change memory cells, with words of different length, and the like).

Furthermore, the numeric examples are merely illustrative and they should not be intended in a limitative manner; in particular, the values of the writing and reading voltages (programming and erasing) can be different from those suggested in the preceding description.

Moreover, an implementation in which a biasing circuit is provided for more than two bit lines and/or for bit lines being not adjacent is included.

It is not excluded that the switch used for transferring the programming voltage can be implemented by bipolar transistors o by circuital structures, which are different from the described ones (for example, by two or more transistors in parallel).

Similar considerations apply for the clamping structure. Indeed, nothing prevents implementing it by using bipolar transistors or different circuital structures.

Moreover, the selection circuits can be driven in a way different from the described one.

Furthermore, it is possible that a general variation of the proposed solution can be applied to the row decoder.

Figure 5:
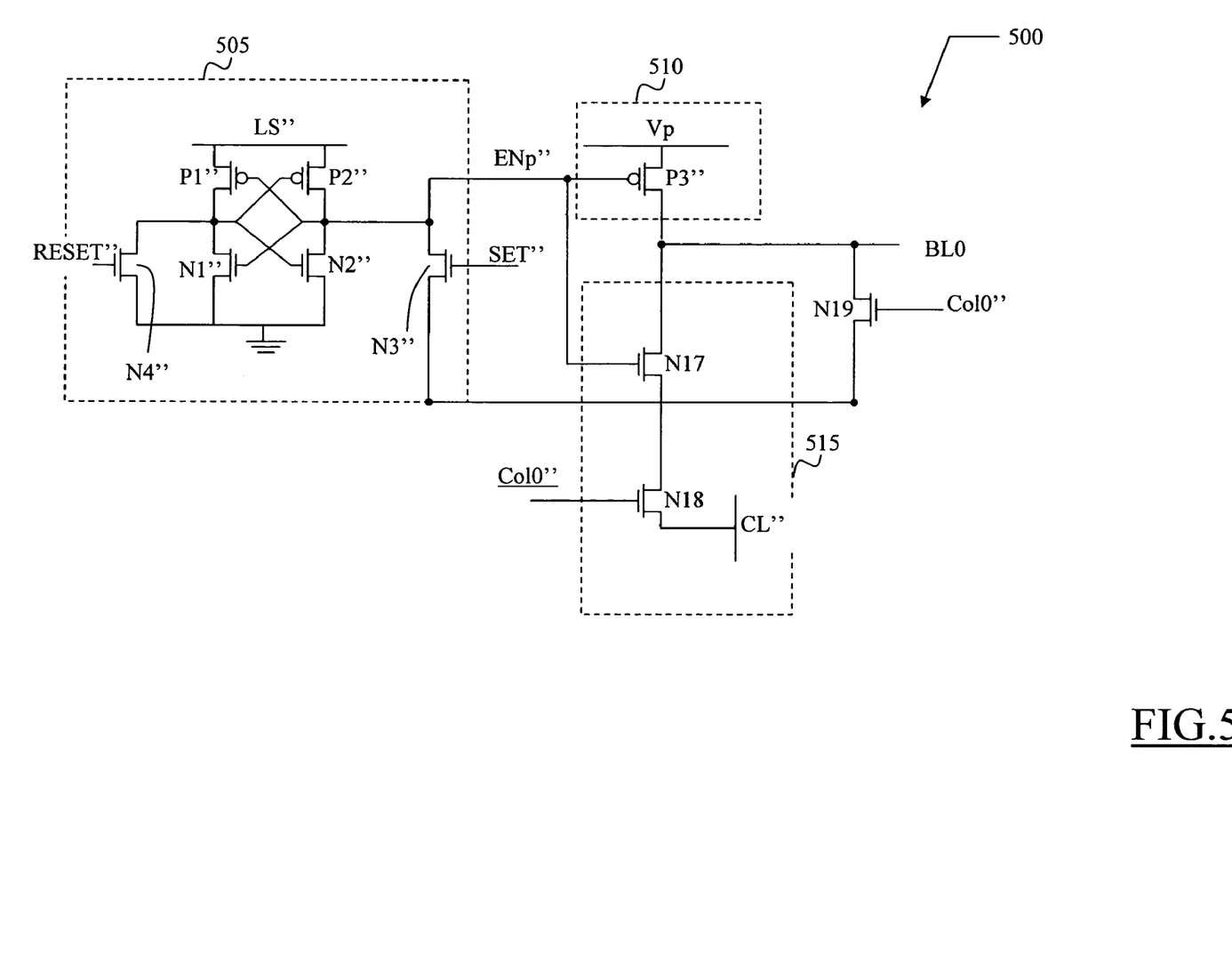
FIG. 5 shows a block diagram of a biasing circuit according to another embodiment of the present invention.

It should be noted that the clamping structure can be advantageously used also for guaranteeing a correct writing operation on the memory cells of an EEPROM memory wherein a dedicated biasing circuit is provided for each bit line. Also in this case, indeed, the clamping circuit guarantees that during the programming of a selected memory cell the information stored in the remaining memory cells remains unchanged (so avoiding the occurrence of any reading errors). For this purpose, FIG. 5 shows a biasing circuit 500 used for writing and reading a selected memory cell coupled with the bit line BL0.

The biasing circuit 500 has a structure similar to the one of the biasing circuit 135 (for this reason, similar elements are denoted by the same references with the adding of two apexes), with the difference that it is associated with a single bit line BL0. In particular, the biasing circuit 500 comprises a memory circuit 505 (for example, with an architecture similar to the memory circuit LCH of the biasing circuit shown in FIG. 3, obtained by the transistors N1", N2", N3", N4", P1", P2"), a switch 510 (for example, implemented by a p-channel MOS transistor P3") and a clamping circuit 515.

The transistor P3" has a source terminal that receives the programming voltage Vp, and a control terminal that receives the programming enabling voltage ENp". Moreover, the transistor P3 has a drain terminal, which is directly connected to the bit line BL0.

The clamping circuit 515 comprises two n-channel MOS transistors N17 and N18. In detail, the transistor N17 has a control terminal that is connected to the drain terminal of the transistor N3" (so receiving the programming enabling signal ENp"), a drain terminal that is connected to the bit line BL0 and a source terminal that is connected to a drain terminal of the transistor N18. The transistor N18 has a source terminal that is connected to the distribution line CL" and a control terminal that receives the complemented signal Col0".

Moreover, the biasing circuit 500 includes a selection n-channel MOS transistor N19, which has a source terminal that is connected to a corresponding sense amplifier (not shown in the figure), a control terminal that receives the signal Col0" and a drain terminal that is connected to the bit line BL0.

During the writing operation, the distribution line CL" receives the clamping voltage VCL while the distribution line LS" reaches the programming voltage Vp. When the memory cell coupled with the bit line BL0 has to be programmed, the control signal SET" is asserted (to the programming voltage Vp) whereas the signal Col0" is deasserted (to the reference voltage). The memory circuit 505 deasserts the programming enabling signal ENp" (to the reference voltage) so that the transistor P3" (on) brings the bit line BL0 to the programming voltage Vp. The transistor N17 is off and the transistor N18 does not conduct—since it is in series to the transistor N17—so insulating the bit line BL0 from the clamped voltage VCL. Vice versa, when the cell coupled with the bit line BL0 has to remain in the starting state or it is not selected for any writing operation, the signals SET" and Col" are deasserted (to the reference voltage). In such case, the memory circuit 505 asserts the programming enabling signal ENp": so the transistor P3 is off and the bit line BL0 is insulated from the programming voltage Vp. At the same time, the transistors N17 and N18 are on so as to bring the bit line BL0 to the clamped voltage VCL (so avoiding the undesired programming operation of the memory cell).

During the reading operation, the distribution line CL" receives the reference voltage whereas the source distribution line LS" receives the supply voltage. The control signal SET" is deasserted (to the reference voltage) whereas the signal Col" is brought to an intermediate value between the supply voltage and the voltage value of the programming voltage Vp (for example, 4V). The memory circuit 505 asserts the signal ENp" (to the supply voltage) so that the transistor P3" (off) insulates the bit line BL0 from the supply voltage.

The transistors N17 and N18 do not conduct (so as to insulate the bit line BL0 from the reference voltage of the distribution line CL) whereas the transistor N19 is on so as to bring the bit line BL0 to the comparison voltage Vc received from the sense amplifier.

Vice versa, when the memory cell coupled with the bit line BL is not selected for the reading operation, the control signals SET" and Col" are both deasserted (to the reference voltage). The transistors N17 and N18 are on, so that the bit line BL brings itself to the reference voltage.

It should be noted that all the transistors of the biasing circuit 500 receive at most voltage differences of the order of the programming voltage Vp at the terminals thereof, so that they can be implemented by medium voltage transistors, so guaranteeing a reduced area occupation with respect to solutions that need transistors being able to sustain voltages higher than the programming voltage Vp between the terminals thereof. Such result is obtained also in this case by the use of switches implemented with p-channel MOS transistors (for example, the transistor P3").

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An EEPROM memory comprising a matrix of individually selectable memory cells, the matrix having a plurality of columns, a plurality of data lines each coupled with the cells of a corresponding column, the data lines being grouped in a plurality of packets, a plurality of biasing elements for providing a biasing signal to the data lines, and means for selecting the biasing elements for a selected one of the packets wherein each biasing element is associated with corresponding data lines of a plurality of packets, the biasing element comprising switching means for selectively applying the biasing signal to a selected one of the associated data lines, wherein each biasing element comprises further switching elements for selectively applying a clamped signal to each non-selected one of the associated data lines.

2. The EEPROM memory according to claim 1, wherein each biasing element is associated with corresponding data lines of a first packet and a second packet, the first packet and the second packet being adjacent.

3. An electronic system comprising an EEPROM memory according to claim 1.

4. An EEPROM memory comprising a matrix of individually selectable memory cells, the matrix having a plurality of columns, a plurality of data lines each coupled with the cells of a corresponding column, the data lines being grouped in a plurality of packets, a plurality of biasing elements for providing a biasing signal to the data lines, and means for selecting the biasing elements for a selected one of the packets wherein each biasing element is associated with corresponding data lines of a plurality of packets, the biasing element comprising switching means for selectively applying the biasing signal to a selected one of the associated data lines, wherein each biasing element comprises a first switch for providing the biasing signal at a programming voltage, a memory element for providing a programming enabling signal that controls the first switch, and a plurality of second switches each for coupling the first switch with a corresponding one of the associated data lines, the second switches being controlled by corresponding selection signals of the associated packets.

5. The EEPROM memory according to claim 4, wherein each biasing element comprises a third switch for providing the clamped signal, the third switch being controlled by the programming enabling signal, and a plurality of fourth switches each for coupling the third switch with a corresponding one of the associated data lines, the fourth switches being controlled by the negated selection signals.

6. The EEPROM memory according to claim 5, wherein the third switch comprises a third transistor of a second type opposed to the first type, said third transistor having a source terminal for receiving the clamped signal, a drain terminal and a control terminal for receiving the enabling programming signal, and wherein each fourth transistor comprises a fourth transistor of the second type, said fourth transistor having a drain terminal connected to the drain terminal of the third transistor, a control terminal for receiving the corresponding negated selection signal and a source terminal coupled with the corresponding data line.

7. The EEPROM memory according to claim 4, wherein each biasing element further comprises a fifth switch for providing the biasing signal at a comparison voltage, the fifth switch being controlled by a reading enabling signal, and a plurality of sixth switches each for coupling the fifth switch with a corresponding one of the associated data lines, the sixth switches being controlled by the selection signals.

8. The EEPROM memory according to claim 7, wherein each biasing element further comprises a seventh switch for providing the clamped signal to the sixth switches, the seventh switch being controlled by a writing enabling signal.

9. The EEPROM memory according to claim 7, wherein the fifth switch comprises a fifth transistor of the second type, said fifth transistor having a source terminal for receiving the comparison voltage, a drain terminal and a control terminal for receiving the reading enabling signal, and wherein each sixth switch comprises a sixth transistor of the second type, said sixth transistor having a source terminal connected to the drain terminal of the fifth transistor, a control terminal for receiving the corresponding selection signal and a drain terminal coupled with the corresponding data line.

10. The EEPROM memory according to claim 7, wherein the seventh switch comprises a seventh transistor of the second type, said seventh transistor having a source terminal connected to the source terminal of each sixth transistor, a drain terminal for receiving the clamped signal and a control terminal for receiving the writing enabling signal.

11. The EEPROM memory according to claim 4, wherein the first switch comprises a first transistor of a first type, said first transistor having a source terminal for receiving the programming voltage, a drain terminal and a control terminal for receiving the programming enabling signal, and wherein each second switch comprises a second switch of the first type, said second transistor having a source terminal connected to the drain terminal of the first transistor, a control terminal for receiving the corresponding selection signal and a drain terminal coupled with the corresponding data line.

12. The EEPROM memory according to claim 11, wherein each transistor is adapted to sustain a voltage difference between each pair of terminals having an absolute value substantially equal to the programming voltage.

13. The EEPROM memory according to claim 11, wherein each transistor of the first type is a p-channel MOSFET having a substrate terminal connected to the source terminal and each transistor of the second type is an n-channel MOSFET.

14. An EEPROM memory comprising a matrix of individually selectable memory cells, the matrix having a plurality of columns, a plurality of data lines each coupled with the cells of a corresponding column, the data lines being grouped in a plurality of packets, a plurality of biasing elements for providing a biasing signal to the data lines, and means for selecting the biasing elements for a selected one of the packets wherein each biasing element is associated with corresponding data lines of a plurality of packets, the biasing element comprising switching means for selectively applying the biasing signal to a selected one of the associated data lines, wherein the matrix has a plurality of rows, the memory cells of each row associated with one packet defining a word, and wherein the EEPROM memory further comprises a plurality of selection lines each coupled with the words of a corresponding packet, a plurality of further biasing elements for providing a further biasing signal to the selection lines, and means for selecting the further biasing element for the selected packet, each further biasing element being associated with the selection lines corresponding to a plurality of packets and comprising further switching means for selectively providing the further biasing signal to a selected one of the associated selection lines.

15. An operating method of an EEPROM memory comprising a matrix of individually selectable memory cells, the matrix having a plurality of columns, a plurality of data lines each coupled with the cells of a corresponding column, the data lines being grouped in a plurality of packets, and a plurality of biasing elements for providing a biasing signal to the data lines, each biasing element being associated with corresponding data lines of a plurality of packets, the method comprising:
selecting the biasing elements for a selected one of the packets,
selectively applying the biasing signal to a selected one of the data lines associated with each selected biasing element, and selectively applying a clamped signal to each non-selected one of the associated data lines.

* * * * *